(12) United States Patent
Bexten et al.

(10) Patent No.: US 6,322,633 B1
(45) Date of Patent: Nov. 27, 2001

(54) WAFER CONTAINER CLEANING SYSTEM

(75) Inventors: Daniel P. Bexten; Jerry R. Norby, both of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/362,157

(22) Filed: Jul. 28, 1999

(51) Int. Cl.[7] ................ B08B 1/02; B08B 3/02; B08B 3/12; B08B 5/02; B08B 9/08
(52) U.S. Cl. .................... 134/1; 134/26; 134/32; 134/33; 134/37; 134/61; 134/104.1; 134/158; 134/184; 134/22.1; 134/23; 134/24; 134/25.1
(58) Field of Search .................. 134/1, 26, 32, 134/33, 37, 221, 61, 104.1, 158, 184, 23, 24, 25.1

(56) References Cited

U.S. PATENT DOCUMENTS

| 5,562,113 | 10/1996 | Thompson et al. |
| 5,738,128 | * 4/1998 | Thompson et al. ............ 134/95.2 |
| 5,972,127 | * 10/1999 | Thompson et al. ............... 134/33 |

FOREIGN PATENT DOCUMENTS

WO 99/15845   4/1999   (WO) .

OTHER PUBLICATIONS

Exhibit A (a SEMAX ILIOS Five cleaner), 1995.*
Exhibit B (a SEMAX Brochure for the SEMAX ILIOS Five Cleaner), 1997.*
Lamm, Ed, "Cleaning Components In a Closed Solvent System", The Journal of Advancing Application in Contamination Control, Oct. 1999, pp. 11–14.
Schumacher, Kevin, Cleaning Method Tested, Precision Cleaning, Sep. 1999, pp. 33–37.

* cited by examiner

*Primary Examiner*—Zeinab El-Arini
(74) *Attorney, Agent, or Firm*—Lyon & Lyon LLP (57) ABSTRACT

A cleaning system for cleaning carriers or containers used to carry semiconductor wafers has a door cleaner adjacent to a centrifugal box cleaner. Box holder assemblies are attached to a rotor within the box cleaner. Upper and lower hooks on the box holder assemblies hold boxes as the rotor spins. The door cleaner has a base which holds doors in a vertical and upright position. An elevator lowers the base into an ultrasonic cleaning tank. The tank lid seals the tank during use. Ultrasonic cleaning fluid is filtered and cycled into and out of the tank. Boxes and their doors, such as front opening unified pods (FOUP) are both efficiently cleaned and handled.

29 Claims, 8 Drawing Sheets

WAFER CONTAINER CLEANING SYSTEM

BACKGROUND OF THE INVENTION

FIELD OF THE INVENTION

The field of the invention is cleaning apparatus for cleaning carriers used to hold and process semiconductor wafers, substrates, flat panel displays and similar flat articles requiring low contamination levels.

The processing of semiconductor wafers, substrates, photomasks, flat panel displays, data disks, and other articles relating to the semiconductor industry (collectively referred to as "wafers") is very sensitive to problems of contamination. These articles require extremely low contamination levels. Even tiny contaminants can cause defects. Accordingly, it is necessary to maintain a high level of cleanliness during virtually all stages of manufacture.

Semiconductor wafers are typically processed in batches. Batch handling may occur throughout the entire production process, or for one or more processing steps or related handling operations. Batch processing almost always uses some type of carrier to hold the wafers. The wafer carriers can be of various designs. Carriers in the form of a protective case or box are often used. In these types of carriers, the wafers are held and enclosed against contamination during travel within the processing facility. The wafer carriers must be cleaned, to avoid having particles and contaminants on the carriers contaminate the wafers. However, cleaning wafer carrying boxes can be difficult because they typically have features such as slots, grooves or apertures.

One type of wafer carrier is known as the front opening unified pod, or FOUP. A FOUP carrier has a five-sided box with an open front. A door attaches to the front of the box, to seal the box against entry of external contaminants, to help keep the wafers clean. The door has a latch mechanism, which is typically adapted to be engaged and operated automatically via robots or other automatic machinery. The latch mechanism is largely contained within hollow spaces within the door. The hollow spaces within the door, and other interior door features, make cleaning the FOUP door difficult, using conventional techniques. The hollow areas trap water or other cleaning fluids. Accordingly, improved apparatus and techniques are needed for cleaning FOUP doors.

Box carriers have been successfully cleaned in centrifugal cleaners. See, for example, U.S. Pat. No. 5,738,128, incorporated herein by reference. In these centrifugal cleaners, the box is loaded onto a rotor, with the open top or front side of the box facing radially outwardly from the rotor. The box is then sprayed with cleaning fluids, and then with drying gases, while the rotor turns. Centrifugal force helps to remove cleaning fluids from the box, to help dry it. While these techniques have worked well for different types of boxes, FOUP carriers have larger five-sided boxes. Accordingly, FOUP boxes cannot be readily loaded onto, or securely held in place on, a conventional rotor in a centrifugal box cleaner. Accordingly, an improved centrifugal box cleaner is needed for use with FOUP boxes.

As FOUP carriers include a box and a separate door, which must both be cleaned, but require different cleaning techniques, a system for efficiently cleaning both of these components of a FOUP container is also needed.

SUMMARY OF THE INVENTION

In a first aspect of the invention, an apparatus for cleaning a door of a wafer carrier includes an ultrasonic transducer within a cleaning tank. An elevator supports a base adapted to hold several doors, with the elevator lifting the doors into and out of the cleaning tank. A tank lid is advantageously attached to the elevator, and seals the tank, when the base is lowered into the tank. The doors are effectively cleaned, notwithstanding their hollow spaces and other difficult-to-clean features.

In a second and separate aspect of the invention, a centrifugal cleaner for cleaning carrier boxes has a rotor within an enclosure. A box holder on the rotor includes upper and lower hooks. An upper front edge of the box is placed behind the upper hooks. The box is rotated into position, and secured on the rotor by the upper and lower hooks. Accordingly, the box is installed and secured onto the rotor without the need for moving latches or other securing components.

In a third and separate aspect of the invention, a system for cleaning carriers used for handling semiconductor wafers includes a box cleaner having a rotor within an enclosure. Box holder assemblies on the rotor include upper and lower hooks for securing boxes to the rotor. A door cleaner is advantageously located adjacent to the box cleaner. The door cleaner has an ultrasonic transducer within a cleaning tank. An elevator moves doors into and out of the cleaning tank. The boxes and doors are efficiently cleaned and handled at a single location.

Other and further objects, inventive features, and vantages, will appear hereinafter.

BRIEF DESCRIPTION OF THE DRAWINGS

In the drawings, wherein the same reference number denotes the same element, throughout the several views.

DETAILED DESCRIPTION OF THE DRAWINGS

Figure 1:
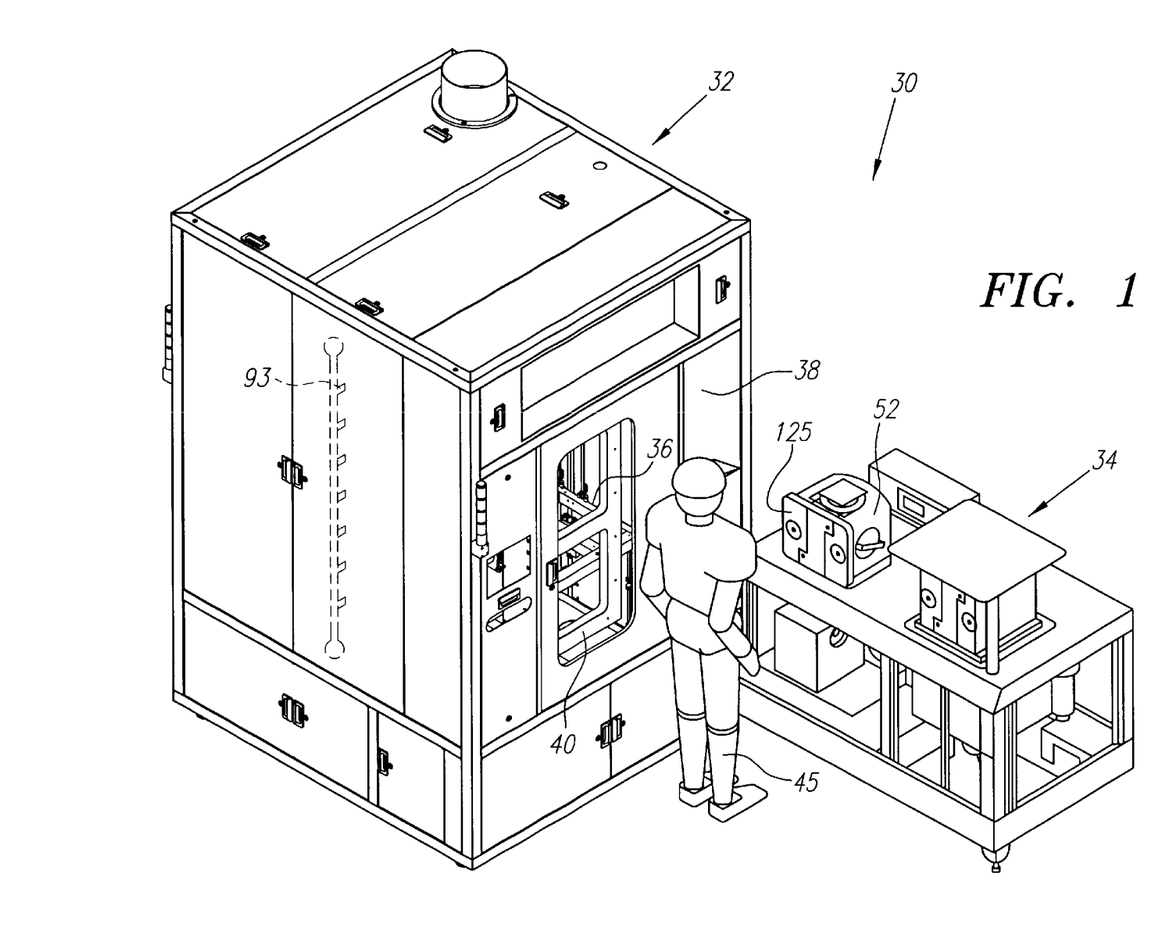
FIG. 1 is a perspective view of a system for cleaning carrier boxes and carrier doors, used in handling semiconductor wafers and similar articles.

Turning now in detail to the drawings, as shown in FIG. 1, a carrier cleaning system 30 includes a centrifugal box cleaner 32, and a door cleaner 34. The door cleaner 34 is preferably located adjacent to the box cleaner 32. A rotor assembly 36 is rotatably supported within an enclosure 38 of the box cleaner 32. The rotor assembly 36 is accessed via an enclosure door 40, which slides open for loading and unloading, and slides closed during cleaning. Spray nozzles 93 are directed inwardly to spray water, water and detergent, solvents, mixtures thereof, or other cleaning liquids generally inward or directly toward the center axis of the processing chamber.

Figure 2:
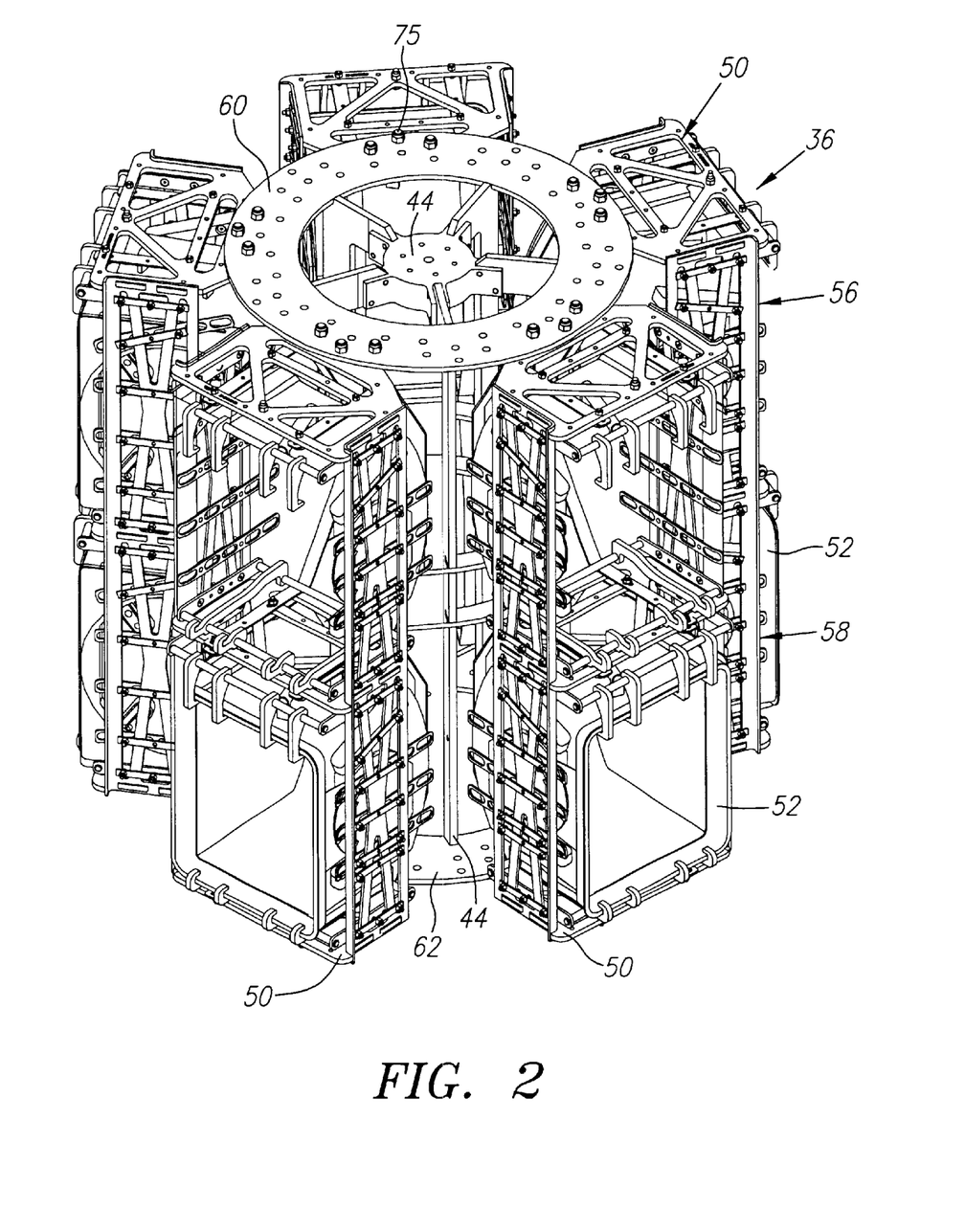
FIG. 2 is a perspective view of the rotor within the box cleaner shown in FIG. 1.
Figure 3:
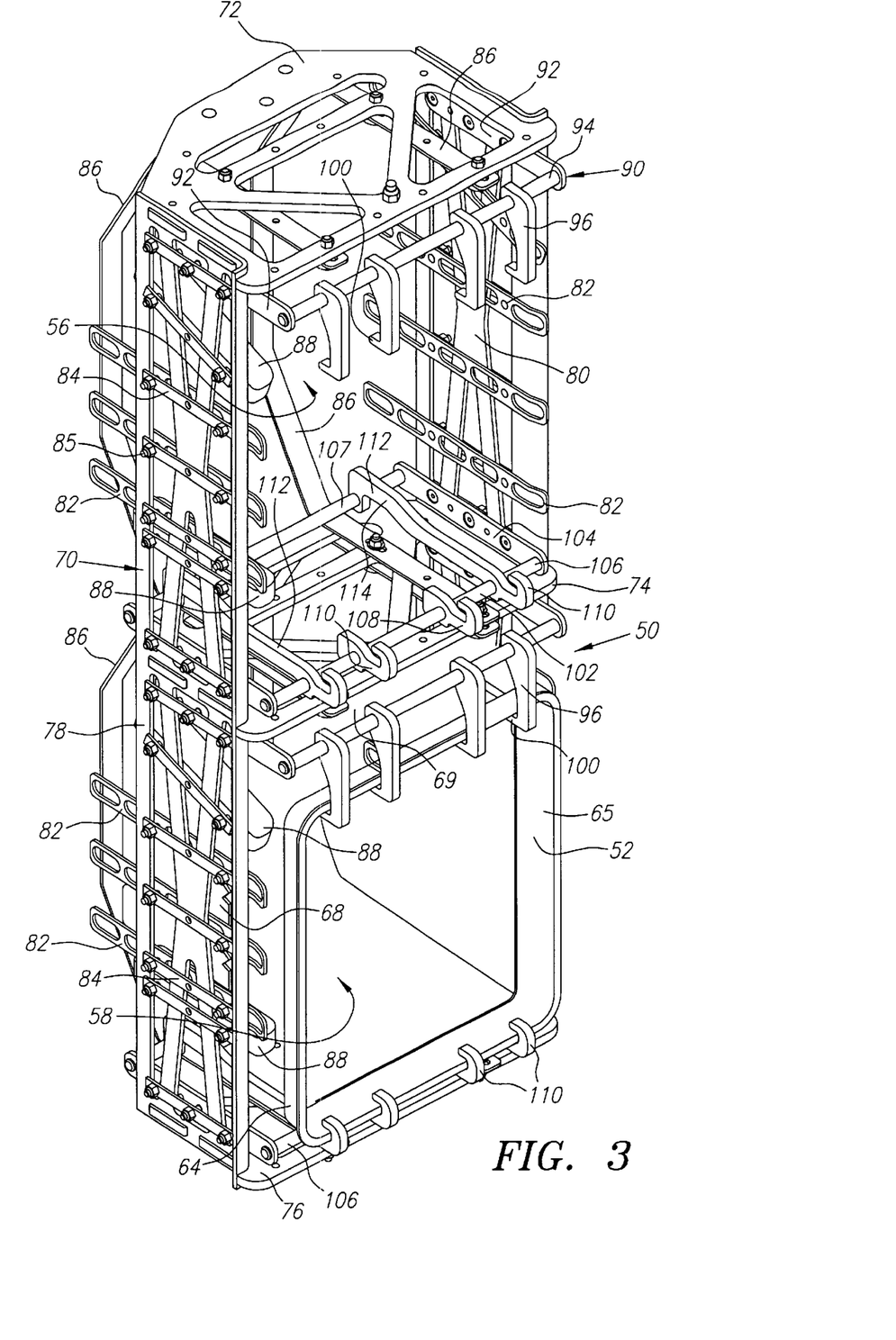
FIG. 3 is an enlarged perspective view of the box holder assemblies shown in FIG. 2.
Figure 4:
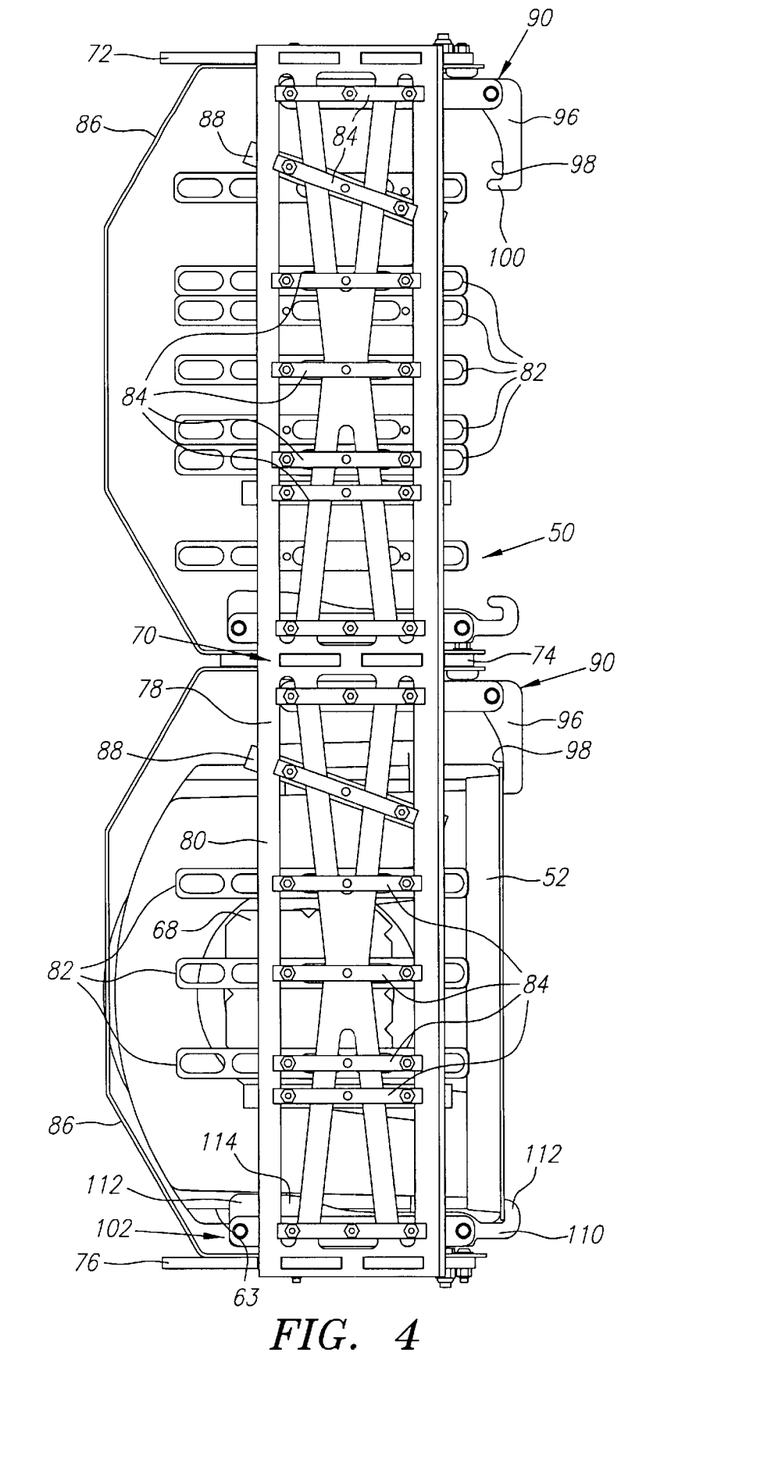
FIG. 4 is a side elevation view thereof.

Turning to FIGS. 2, 3 and 4, holder assemblies 50 are attached to, and form part of, the rotor assembly 36, within the box cleaner 32. The rotor assembly 36 has a top ring plate 60 and a bottom ring plate 62 attached to a core structure 44. The holder assemblies 50 are rigidly attached to the top and bottom ring plates 60 and 62 via bolts 75.

Referring to FIGS. 3 and 4, each holder assembly 50 has a top plate 72, a middle plate 74, and a bottom plate 76 joined to side plates 78 and 80. An upper box position 56 is formed between the top plate 72 and the middle plate 74. Similarly, a lower box position 58 is formed between the middle plate 74 and the bottom plate 76.

A plurality of side bumpers 82 are attached to the inside surfaces of the side plates 78 and 80, via clamp brackets 84, on the outside surfaces of the side plates 78 and 80, and via fasteners 85 extending through the side bumpers 82, clamp brackets 84, and optionally also through the side plates 78 and 80. Upper and lower misload bumpers 88 are attached to the inside surface of the side plate 78. As shown in FIG. 3, the upper misload bumper 88 in both the upper box position 56 and the lower box position 58 is angled downwardly towards the front opening of each box position 56 and 58, while the lower misload bumper 88 is generally horizontal, in each box position 56 and 58.

As best shown in FIG. 4, a pair of spaced apart rear guides 86 are attached to the top plate 72 and middle plate 74. A pair spaced-apart rear guides 86 are also similarly attached to the middle plate 74 and bottom plate 76. The rear guides 86 extend rearwardly behind the side plates 78 and 80, in a semi-octagonal configuration.

Referring to FIG. 3, an upper hook assembly 90 has arms 92 attached to the side plates 78 and 80. A crossbar 94 extends between the arms 92. Hooks 96 extend downwardly from the crossbar 94. As better shown in FIG. 4, each hook 96 has a downwardly extending leg 98, and a foot 100 substantially perpendicular to the leg 98, and extending inwardly.

Turning back to FIG. 3, a lower hook assembly 102 similarly has arms 104 attached to the side plates 78 and 80. A front crossbar 106 extends between the arms 104. Center hooks 108 mounted on the crossbar 106 each have an inwardly extending foot 110. Base bars 112, positioned to the outside of the hooks 108, are supported on the front crossbar 106, and also on a rear crossbar 107 attached to the arms 104. Each base bar 112 has a ramp section 114, which ramps upwardly from the front crossbar 106 to the rear crossbar 107, i.e., from front to rear.

In the embodiment shown in FIG. 2, five holder assemblies 50 are equally radially spaced apart on the rotor assembly 36. Each holder assembly 50 has an upper box position 56 and a lower box position 58. Each upper and lower box position 56 and 58 has upper and lower hook assemblies 90 and 102, side bumpers 82, and misload bumpers 88, as described above.

Figure 5:
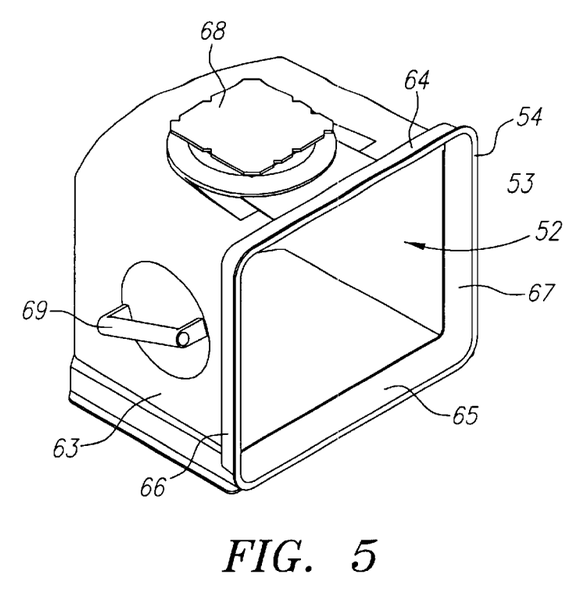
FIG. 5 is a perspective view of a carrier box.

Turning now to FIG. 5, a (FOUP) carrier box 52 has an open front 53 surrounded by a frame or bezel 54. The frame 54 has a top rim 64, a bottom rim 65 a left side rim 66, and a right side rim 67. Handles 69 are attached to side walls 63 of the box 52. A fitting 68 is attached to the top surface of the box 52, for engagement by a robot or other automatic manipulator.

Referring momentarily to FIG. 1, the box cleaner 32 is described above. The door cleaner 34, which together with the box cleaner 32 forms the container cleaning system 30, is now described.

Figures 7, 8:
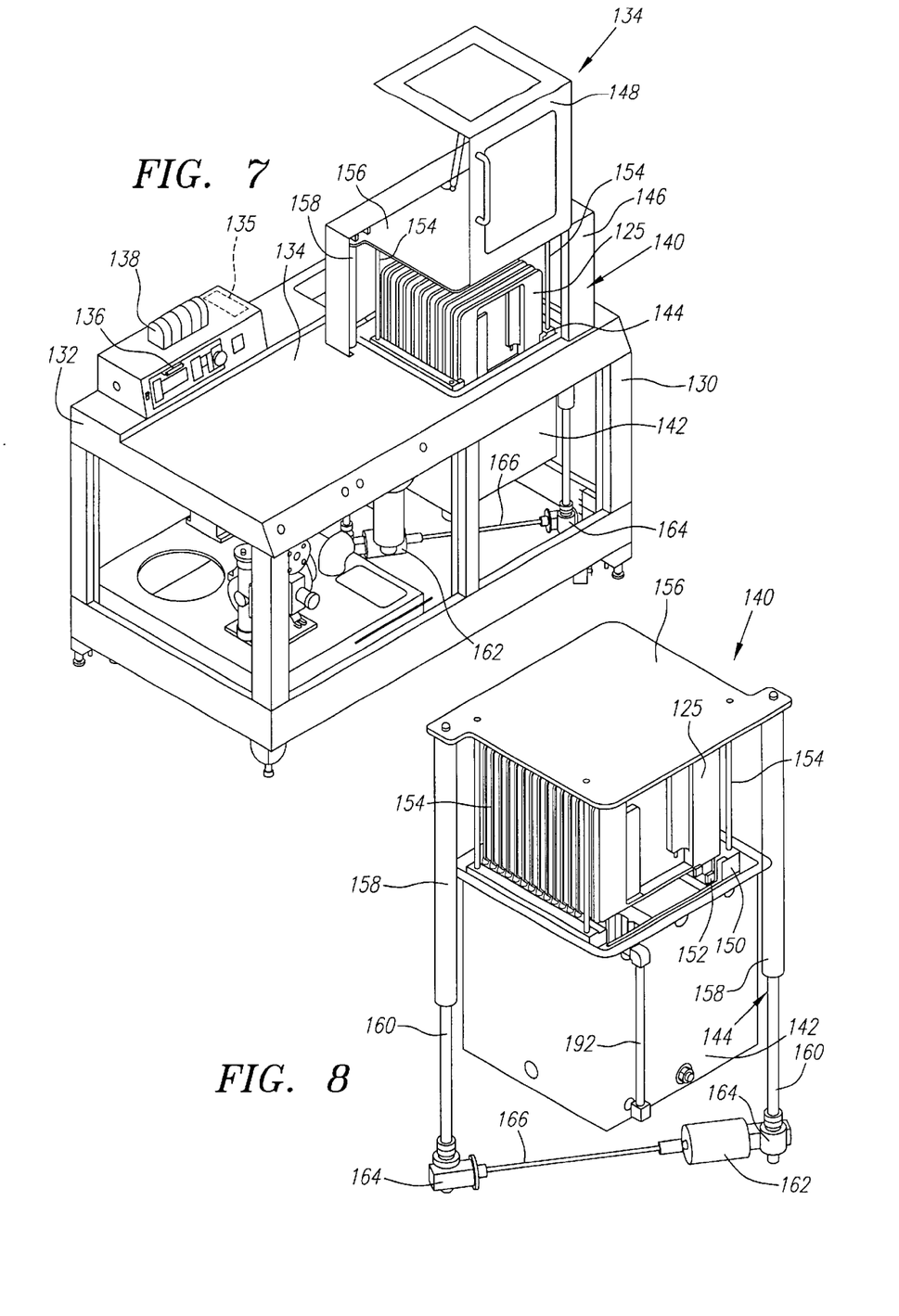
FIG. 7 is a perspective view of the carrier door cleaner shown in FIG. 1.
FIG. 8 is a perspective view of the elevator and tank shown in FIG. 7.

As shown in FIG. 7, the door cleaner 34 has a frame 130 including a bench top 132 which provides a work space 134.

A control panel 136 is located at the back of the bench 132. Indicator lights 138 on the control panel 136 provide a visual indication of status of the door cleaner 34. The door cleaner 34 includes a cleaning unit 140 alongside the work space 134. The cleaning unit 140 has a process tank 142 extending downwardly from the bench surface 132. An enclosure 146 fixed to the top surface of the bench 132 is positioned over and around the tank 142. An enclosure door 148 pivotably attached to the tank enclosure 146 pivots up to allow doors 125 to be loaded into and unloaded from the cleaning unit 140. The enclosure door 148 pivots downwardly to close off the tank 142 from the surrounding environment, during cleaning.

Figure 9:
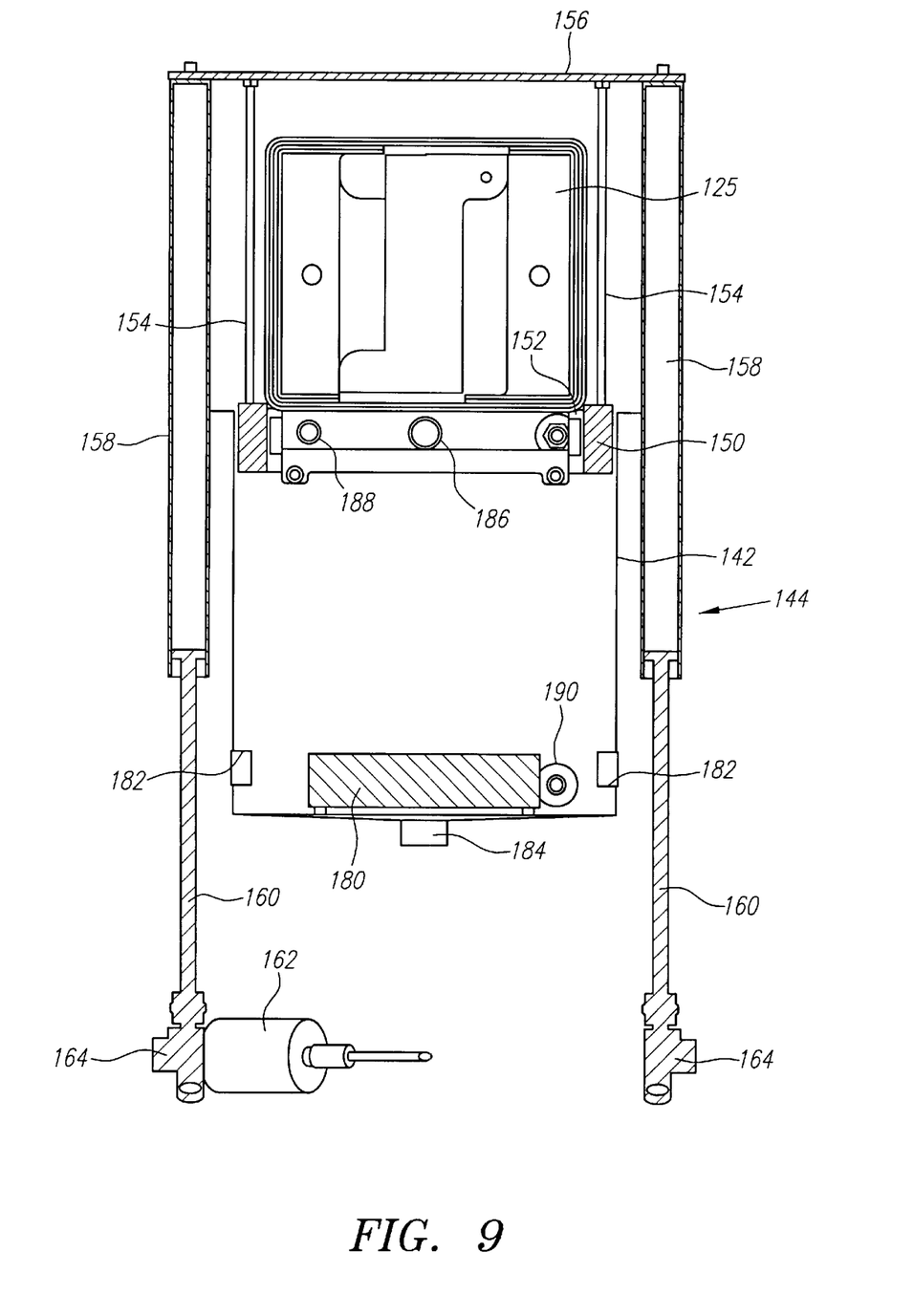
FIG. 9 is a side view thereof, in part section.

As shown in FIGS. 8 and 9, the cleaning unit 140 includes an elevator 144. The elevator has a base 150. The doors 125 are supported on the base 150 between door holder tabs 152, which hold the doors 125 upright and slightly spaced apart, on the base 150. Lift rods 154 extend upwardly from the base 150 and are attached to a tank lid 156. The tank lid 156 is in turn supported on lift tubes 158 at opposite diagonal corners. The lift tubes 158 have internal threads engaged over lead screws 160. The lead screws 160 are rotated via an elevator motor 164 turning a driveshaft 166 through right angle drives 164. As shown in FIG. 9, an ultrasonic transducer 180 is located at the bottom of the tank 142. An interlock prevents movement of the elevator when the enclosure door 148 is open.

Figure 10:
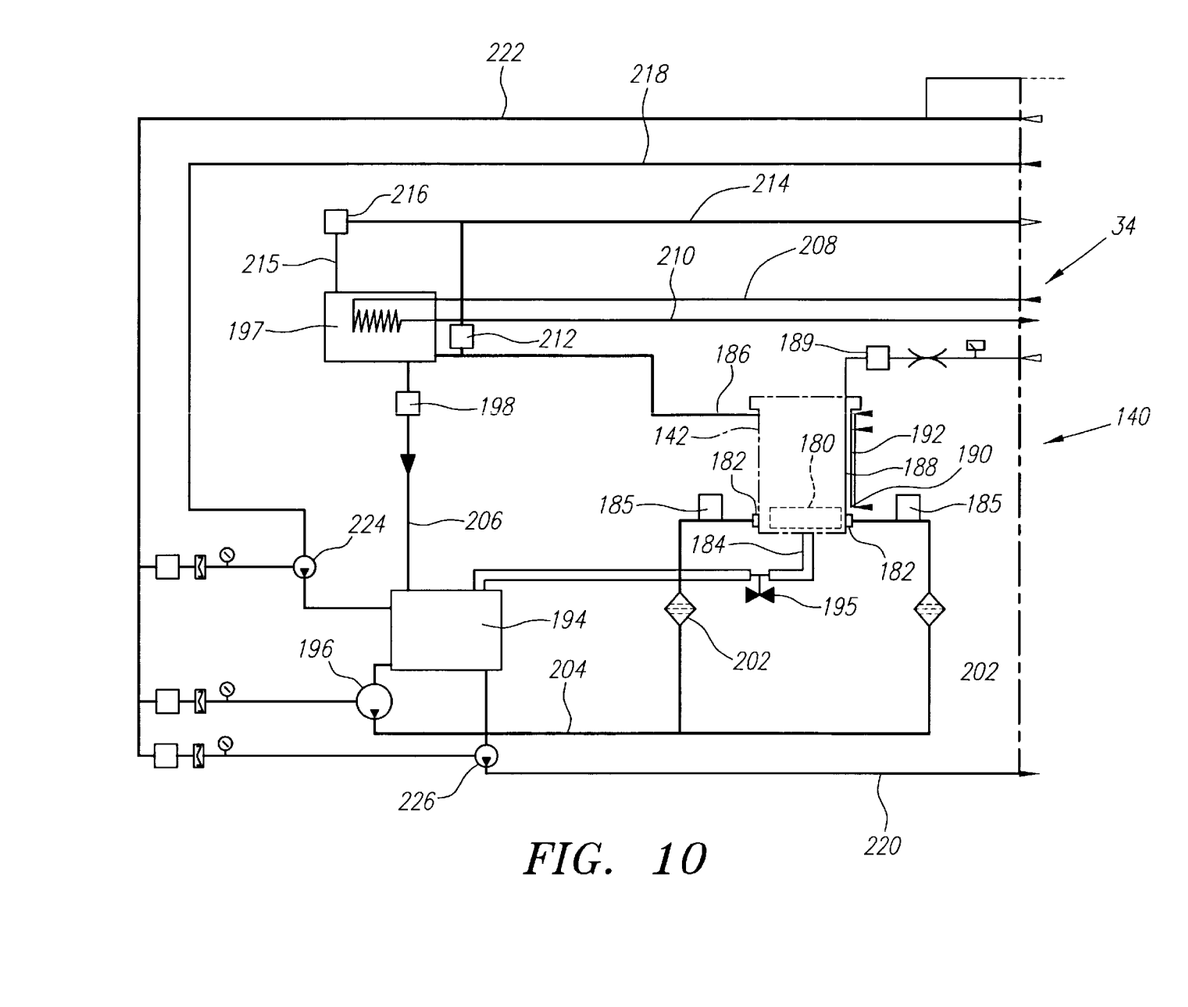
FIG. 10 is a schematic view of the door cleaner shown in FIG. 7.

As shown in FIGS. 9 and 10, a drain line 184 at the bottom of the process tank 142 connects to a reclaim tank 194 under the bench 132 on the frame 130. A fluid fill line 204 runs from the reclaim tank 194 to a delivery pump 196, then through parallel filters 202 and into fill ports 182 at the bottom of the process tank 142. A drain valve 195 controls flow from the drain 184 into the reclaim tank 194. A level sensing entry port 190 connects the process tank 142 to a level sensing tube 192 extending upwardly alongside the tank for sensing fluid level within the tank 142.

A tank vapor exhaust line 186 extends from the top of the tank 142 to an exhaust valve 212, which allows tank exhaust to a flow out via an exhaust line 214, or into a vapor condenser 197. Chilled water supply and return lines 208 and 210 connect the vapor condenser 197 to a source of chilled water. A condensate return line 206 runs from the vapor condenser 197 through a breather valve 198 into the reclaim tank 194. A chemical solution supply line 218 connects into the reclaim tank 194 through a fill pump 224. A clean dry air supply line 222 connects into the fill pump 224, the delivery pump 196, and to a drain pump 226 connecting into a chemical solution drain 220, to drive the pumps pneumatically. Alternatively, electrically powered pumps may be used. A vapor condenser exhaust line 215 extends out of the vapor condenser 197, through a condenser exhaust valve 216 and into the exhaust line 214.

A nitrogen purge system 188 provides nitrogen gas through a purge valve 189, to purge the process tank 142 and the lines connecting to the tank. Via use of the nitrogen purge system 188, and the valves 212, 198, 189 and 216, ambient air and humidity can be purged from the cleaning unit 140. Purging reduces or eliminates condensed water vapor in the cleaning unit 140.

A computer controller 135 is linked to the various valves, pumps, sensors, and other components to control operations of the door cleaner 34.

Referring back to FIG. 1, in use, boxes 52 to be cleaned are transported to the container cleaning system 30. A system operator 45 typically lifts a box 52 from a cart and places the box onto the work space 134 of the door cleaner 34. The a operator 45 then removes the door 125, and loads the door onto the base 150 of the elevator 144 in the door cleaner 34.

To then load the box 52 into the box cleaner 32, the operator 45 turns the rotor assembly 36, via a control panel, until an empty holder assembly 50 is aligned with the opening of the enclosure door 40. The enclosure door slides open and closed automatically via operator control of the control panel.

Figure 6:
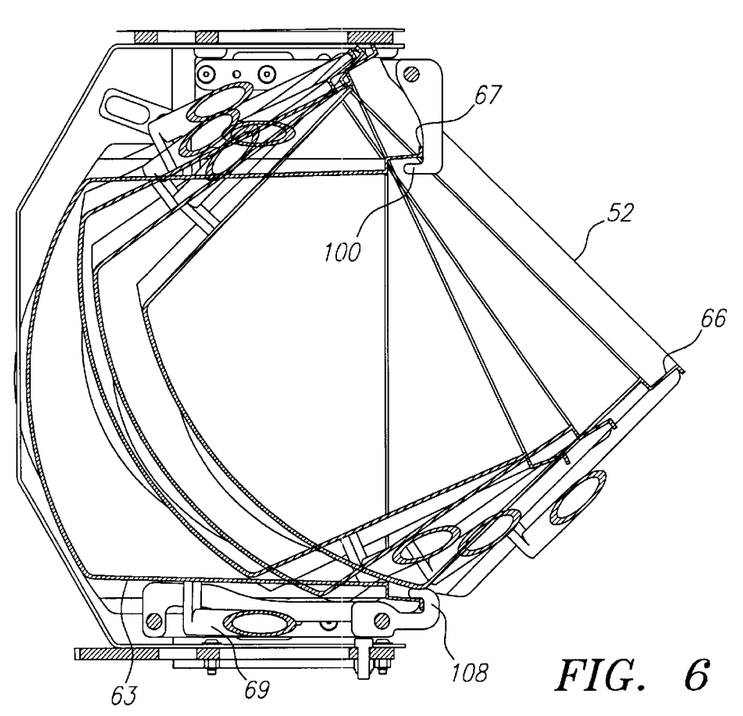
FIG. 6 is a side view, in part section, showing the load sequence of the box shown in FIG. 5, into the holder assembly shown in FIGS. 3 and 4.

Referring to FIG. 6, the operator turns the box 52 so that the right side rim 67 is on top. The operator 45 then moves the box 52 into the open box position 56 or 58, with the right side rim 67 of the box 52 positioned above and behind the hooks 96. The operator 45 then continues to move the box 52 into the box position 56 or 58, by moving the box 52 through the sequence shown in FIG. 6. After the left side rim 66 of the frame 54 of the box 52 moves behind the lower hooks 108, the operator 45 moves the box 52 downwardly, so that, as shown in FIGS. 3, 4 and 6, the feet 100 on the upper hooks 96 extend under the rim 67, and the feet 110 of the lower hooks 108 extend over and engage the rim 66 of the box 52.

Referring to FIG. 6, during the loading sequence, the ramp section 114 of the base bars 112 helps to guide the box 52 into the correct position. The rear guides 86 also help to guide the box 52 into place, by preventing the box from moving too far back in the holder assembly 50. The side bumpers 82 help to guide the box 52 laterally into place. The misload bumpers 88 prevent the box 52 from being loaded into the holder 50, unless the box 52 is properly oriented. The components of the holder 50 which contact the box 52 are preferably made of materials which do not generate excessive particles, via abrasion, etc.

Following the steps described above, the operator 45 continues loading boxes 52 into empty box positions 56 and 58. The doors 125 removed from the boxes are correspondingly loaded onto the base 150 in the door cleaner 34. When all positions are loaded with a box 52, or when there are no further boxes to be cleaned, the operator 45 closes the enclosure door 40 and initiates the cleaning sequence. The rotor assembly 36 spins and cleaning fluids are sprayed onto the boxes 52. Drying gases are then used to dry the boxes 52, as described, for example, in U.S. Pat. No. 5,738,128. After the boxes 52 have been cleaned and dried, they are unloaded and removed from the box cleaner 32 following the reverse of the sequence of steps described above.

As each door 125 is removed from a box 52, the operator 45 manually places the door 125 onto the base 150 in the cleaning unit 140 of the door cleaner 34. The doors 125 are held vertically upright via the holder tabs 152 on the base 150. The process tank 142, at this time, is empty (filled with ambient air). In the embodiment shown, the cleaning unit 140 has a ten-door capacity. The doors 125 are spaced slightly apart by the holder tabs 152.

With the base loaded with doors, the operator 45 initiates the cleaning sequence using the control panel 136. The enclosure door 148 is closed. The elevator motor 162 is energized, lowering the base 150 and doors 125 into the tank 142. With the elevator 144 fully lowered, the tank lid 156 seals against the surrounding top surface of the bench 132. This provides a sealed cleaning unit 140, which advantageously keeps the costly cleaning fluid in, and keeps ambient air and humidity out.

The nitrogen purge valve 189 is opened. Nitrogen flows into the tank to purge atmospheric air. As this occurs, the condenser exhaust valve 216 is momentarily opened to exhaust atmospheric air. After atmospheric air is purged, the valves 189 and 216 are closed.

The tank 142 is filled with fluid by opening the breather valve 198, and the tank fill valves 185. The delivery pump 196 is switched on, and fluid is pumped from the reclaim tank 194 through the fill lines 204, filters 202, valves 185, and into the tank 142 via the fill ports 182. The cleaning fluid is preferably hydrofluoroether (HFE) ($C_4F_9OCH_3$, Methyl Nonafluorobutyl Ether), available from 3M Corporation, St. Paul, Minn.

The ultrasonic transducer 180 is energized. The doors 125 are ultrasonically cleaned in the tank 142. After cleaning is completed, the breather valve 198 and the drain valve 195 are opened. The fluid flows from the process tank 142 back into the reclaim tank 194, via gravity.

The foregoing steps of filling the process tank 142, ultrasonically cleaning, and draining the process tank are advantageously repeated for a desired number of cycles.

The HFE is condensed in a reclaim cycle. With the exhaust valve 212 closed, the condenser exhaust valve 216, and the nitrogen purge valve 189 are opened for a predetermined interval and are then closed. Chilled water runs through the vapor condenser 194. Condensed vapor drains back into the reclaim tank 194 through the condensate return line 206. Uncondensed vapor is exhausted through the exhaust line 214.

The elevator motor 162 is then energized in the reverse direction to raise the base 150 back up until it is about at the same level as the bench 132. This unseals the process tank. The tank enclosure door 148 is opened and the box doors 125 are removed from the base. Optionally, each door 125 may be reinstalled onto a box 52 on the work space 134, as the cleaned boxes 52 are removed in sequence from the box cleaner 32. Via appropriate sequencing, each door 125 can be reinstalled onto the specific box 52 which it originally was provided with.

To process the next batch of doors, the steps described above are repeated. The Nitrogen purge is preferably used between each batch of doors to keep condensed water out of the tanks and pipes.

Thus, a novel container cleaning system has been shown and described. Various modifications and substitutions of equivalents may, of course, be made without departing from the spirit and scope of the invention. The invention, therefore, should not be restricted, except by the following claims, and their equivalents.

What is claimed is:

1. A system for cleaning containers used for handling semiconductor wafers and similar objects, with the containers including a box and a separate door for sealing the box, comprising:
   a box cleaner including:
      an enclosure;
      a rotor within the enclosure;
      spray nozzles in the enclosure for spraying fluid towards the rotor;
      a plurality of box holder assemblies attached to the rotor, with each box holder assembly including upper and lower hook assemblies; and
   a door cleaner including:
      a cleaning liquid tank;
      an ultrasonic transducer in the cleaning liquid tank; and
      an elevator for moving doors into and out of the cleaning liquid tank.

2. The system of claim 1 with each box holder assembly further comprising upper and lower box holders and a rear guide.

3. The system of claim 1 further comprising a plurality of side bumpers in each box holder.

4. The system of claim 3 further comprising a misload bumper in each of the box holders.

5. The system of claim 1 with the upper hook assembly further comprising a plurality of spaced apart hooks, with each of the hooks having a foot facing inwardly into the box holder.

6. The system of claim 1 further comprising a ramp base bar in each box holder assembly.

7. The system of claim 1 wherein each box holder assembly includes at least one box holder having an open end facing radially outwardly on the rotor.

8. The system of claim 1 with the door cleaner separate from and adjacent to the box cleaner.

9. The system of claim 1 with the door cleaner further including a tank lid attached to the elevator, and with the tank lid movable between an open position, for loading and unloading doors into the door cleaner and a closed position, wherein the tank lid substantially seals the tank, for cleaning the doors.

10. The system of claim 1 further comprising a drain in the cleaning liquid tank connected to a reclaim tank in the door cleaner, for draining a cleaning liquid from the cleaning liquid tank, and a pump connected to the reclaim tank and to the cleaning liquid tank, for filling the cleaning liquid tank with a cleaning liquid.

11. The system of claim 10 further comprising a vapor condenser connecting to a top space of the liquid cleaning tank.

12. A method of cleaning a container having a box and a door attachable to the box to seal the box, with the box having a top and a bottom comprising the steps of:
   separating the door from the box;
   loading the box into a box holder on a rotor within a box cleaner by placing an upper front edge of the box behind an upper hook in the box holder; lifting the box upwardly; rotating the box to move the bottom of the box into the box holder; moving a lower front edge of the box over a lower hook in the box holder; and lowering the box to seat the lower front edge of the box behind the lower hook;
   rotating the rotor;
   spraying a cleaning fluid onto the box; and
   drying the box.

13. The method of claim 12 further comprising the step of drying the box by flowing a primary drying gas downwardly over the box and jetting a secondary drying gas over the box.

14. A method for cleaning a door of a container for handling semiconductor materials and similar items, with the door having hollow interior spaces, comprising the steps of:
   loading the door onto a base, in a vertical orientation;
   lowering the base into a tank of liquid;
   allowing the liquid to fill the interior hollow spaces of the door;
   introducing ultrasonic energy into the liquid;
   lifting the door out of the tank of liquid;
   allowing the liquid in the hollow interior spaces to drain out of the hollow interior spaces and back into the tank; and
   removing the door from the base.

15. A box cleaner comprising:
   an enclosure;
   a rotor within the enclosure;
   a plurality of spray nozzles in the enclosure for spraying fluid towards the rotor;
   a box holder on the rotor, the box holder having:
      at least one upper hook at an upper end of the box holder;
      at least one lower hook at a lower end of the box holder;
      an upper leg on the upper hook extending downwardly towards the lower end of the box holder;
      a lower leg on the lower hook extending upwardly towards the upper end of the box holder; and
      a foot on the lower hook facing inwardly towards a center of rotation of the rotor.

16. The box cleaner of claim 15 further including a rear guide in the box holder.

17. The box cleaner of claim 15 further comprising a plurality of side bumpers in the box holder.

18. The box cleaner of claim 15 further comprising a misload bumper in the box holder.

19. The box cleaner of claim 15 further comprising a ramp base bar in the box holder.

20. The box cleaner of claim 15 wherein the box holder has an open end facing radially outwardly on the rotor.

21. A cleaner for cleaning a door of a container for handling semiconductor wafers and similar articles, comprising:
   a cleaning tank;
   an ultrasonic transducer in the tank;
   a base;
   a plurality of tabs on the base adapted to hold a door in a vertical orientation;
   an elevator attached to the base and operable to move the base to a first position wherein the base is immersed in the tank, and to a second position, wherein the base is above the tank.

22. The cleaner of claim 21 further comprising a tank lid attached to the elevator, the tank lid sealing off the tank when the base is in the first position.

23. The cleaner of claim 21 further comprising a drain line connecting the cleaning tank to a reclaim tank, and a pump line connecting the reclaim tank to a pump and connecting the pump to the cleaning tank.

24. The cleaner of claim 23 further comprising an enclosure enclosing the tank and the tank lid.

25. The cleaner of claim 24 further comprising an enclosure door on the enclosure and an interlock system linked to the enclosure door.

26. A box cleaner comprising:
   an enclosure;
   a rotor within the enclosure;
   a plurality of spray nozzles positioned to spray a fluid towards the rotor;
   a box holder assembly on the rotor, with the box holder assembly for holding a box having a top, a bottom, a back left side and a right side, the box holder assembly having at least one upper hook and at least one lower hook, and with the upper hook including an upper hook leg extending downwardly towards the lower hook, and with the lower hook having a lower hook leg and a lower hook foot attached on the lower hook leg and extending inwardly towards the axis of rotation of the rotor.

27. The box cleaner of claim 26 further comprising a plurality of upper hooks in an upper hook assembly of the box holder assembly, and a plurality of lower hooks in a lower hook assembly of the box holder assembly.

28. The box cleaner of claim 26 where the upper hook is fixed in position in the box holder assembly.

29. The box cleanser of claim 26 where the lower hook foot is perpendicular to the lower hook leg.

* * * * *